(12) United States Patent
Niu et al.

(10) Patent No.: US 12,289,841 B2
(45) Date of Patent: Apr. 29, 2025

(54) ELECTRONIC APPARATUS

(71) Applicant: LENOVO (SINGAPORE) PTE. LTD., Singapore (SG)

(72) Inventors: Wenjin Niu, Yokohama (JP); Takehito Yamauchi, Yokohama (JP); Keita Ishikawa, Yokohama (JP); Shigehiro Horiuchi, Yokohama (JP); So Nakanishi, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 184 days.

(21) Appl. No.: 18/159,980

(22) Filed: Jan. 26, 2023

(65) Prior Publication Data
US 2023/0300991 A1 Sep. 21, 2023

(30) Foreign Application Priority Data
Mar. 16, 2022 (JP) ................. 2022-041269

(51) Int. Cl.
*H05K 3/30* (2006.01)
(52) U.S. Cl.
CPC ................... *H05K 3/305* (2013.01)
(58) Field of Classification Search
CPC ..... H05K 3/305; G06F 1/1616; G06F 1/1637; G06F 1/1633; G02F 1/133308; G02F 1/133325; G02F 2201/46; G02F 2202/28
See application file for complete search history.

(56) References Cited

U.S. PATENT DOCUMENTS

| | | | |
|---|---|---|---|
| 10,831,234 B1* | 11/2020 | Watamura | G06F 1/1652 |
| 2006/0125364 A1* | 6/2006 | Takeda | H05K 7/20963 313/46 |
| 2013/0342495 A1* | 12/2013 | Rappoport | H05K 9/0054 361/679.01 |
| 2017/0227809 A1* | 8/2017 | Sato | G02F 1/133606 |

FOREIGN PATENT DOCUMENTS

| | | |
|---|---|---|
| JP | 2020135744 A | 8/2020 |
| WO | 9967164 | 12/1999 |
| WO | 2016067324 A1 | 5/2016 |

* cited by examiner

*Primary Examiner* — Abhishek M Rathod
*Assistant Examiner* — Keon Kim
(74) *Attorney, Agent, or Firm* — SHIMOKAJI IP

(57) ABSTRACT

An electronic apparatus includes a display panel and a chassis member that are fixed by a tensile-peelable first adhesive tape, second adhesive tape, and third adhesive tape. The first adhesive tape is located along a first edge of the chassis member. The third adhesive tape is located along a third edge of the chassis member. The second adhesive tape is located between the first adhesive tape and the third adhesive tape and orthogonal to the first adhesive tape and the third adhesive tape. The first adhesive tape and the third adhesive tape respectively have a first tab and a third tab for tensile peeling operation extending to a second edge of the chassis member. The second adhesive tape has a second tab for tensile peeling operation extending from one end thereof to the second edge.

6 Claims, 6 Drawing Sheets

ELECTRONIC APPARATUS

BACKGROUND OF THE INVENTION

Field of the Invention

The present invention to an electronic apparatus including a display panel.

Description of the Related Art

An electronic apparatus such as a laptop PC includes a display panel such as a liquid crystal display (see, for example, Japanese Patent No. 6715973). Typically, the rear surface of the display panel is supported by the inner surface of a chassis member.

SUMMARY OF THE INVENTION

The use of double-sided adhesive tape as a means of fixing the display panel to the chassis member makes an engagement structure unnecessary and reduces the costs, and also eases assembly because screwing and the like are unnecessary. If the double-sided adhesive tape used is tensile peelable (i.e., peelable by pulling), the display panel can be easily removed during maintenance or the like. Such double-sided adhesive tape is provided with a tab for tensile peeling operation.

To stably fix the display panel to the chassis member, it is desirable to use double-sided adhesive tape that extends vertically and horizontally. However, in the case where the double-sided adhesive tape has a shape extending vertically and horizontally such as a cross, the letter L, or the letter T, cutting the double-sided adhesive tape out of the material sheet is wasteful and leads to higher costs.

The present invention has been made in view of the foregoing problems of the conventional techniques, and has an object of providing an electronic apparatus in which a display panel can be removed easily and that is low in cost.

To solve the problems and achieve the object stated above, an electronic apparatus according to an aspect of the present invention is an electronic apparatus including: a display panel; a rectangular chassis member having a first edge, a second edge orthogonal to the first edge, a third edge orthogonal to the second edge and opposite to the first edge, and a fourth edge orthogonal to the third edge and opposite to the second edge, on a rear surface side of the display panel; a tensile-peelable first adhesive tape that fixes the display panel and the chassis member to each other; and a tensile-peelable second adhesive tape that is separate from the first adhesive tape, wherein the first adhesive tape is located along the first edge, and has a first tab for tensile peeling operation extending to the second edge, and wherein the second adhesive tape is located in a direction orthogonal to the first adhesive tape, and has a second tab for tensile peeling operation extending from one end thereof to the second edge. This eases the removal of the display panel and also reduces the costs.

The first tab and the second tab may overlap in vicinity of the second edge. Thus, the width occupied by the ends of the first tab and the second tab shortens, so that the layout of the other components is less affected.

A recessed portion capable of storing the first tab and the second tab may be formed in the second edge of the chassis member. Such a recessed portion is suitable for storing the first tab and the second tab.

Part of the second tab may be peelably fixed to the chassis member. This can prevent contact and adhesion between the second tab and the first adhesive tape adjacent to each other.

The electronic apparatus may further include a tensile-peelable third adhesive tape that fixes the display panel and the chassis member to each other, the third adhesive tape may be located along the third edge, and the third adhesive tape may have a third tab for tensile peeling operation extending to the second edge. With such third adhesive tape, the display panel can be fixed more stably.

The second adhesive tape may comprise two second adhesive tapes arranged side by side in a longitudinal direction with a gap therebetween, the second tab of one of the two second adhesive tapes that is closer to the first edge may overlap the first tab in vicinity of the second edge, and the second tab of the other one of the two second adhesive tapes that is closer to the third edge may overlap the third tab in the vicinity of the second edge. Wiring can be passed through this gap.

According to the above-described aspect of the present invention, the display panel can be easily removed by a simple operation of pulling out the first tab and the second tab. Moreover, since the first adhesive tape and the second adhesive tape are separate and each have a thin tape shape, cutting these tapes out of the material sheet is not wasteful and the costs are low.

DETAILED DESCRIPTION OF THE INVENTION

An embodiment of an electronic apparatus according to the present invention will be described in detail below, with reference to the drawings. The present invention is not limited by this embodiment.

Figure 1:
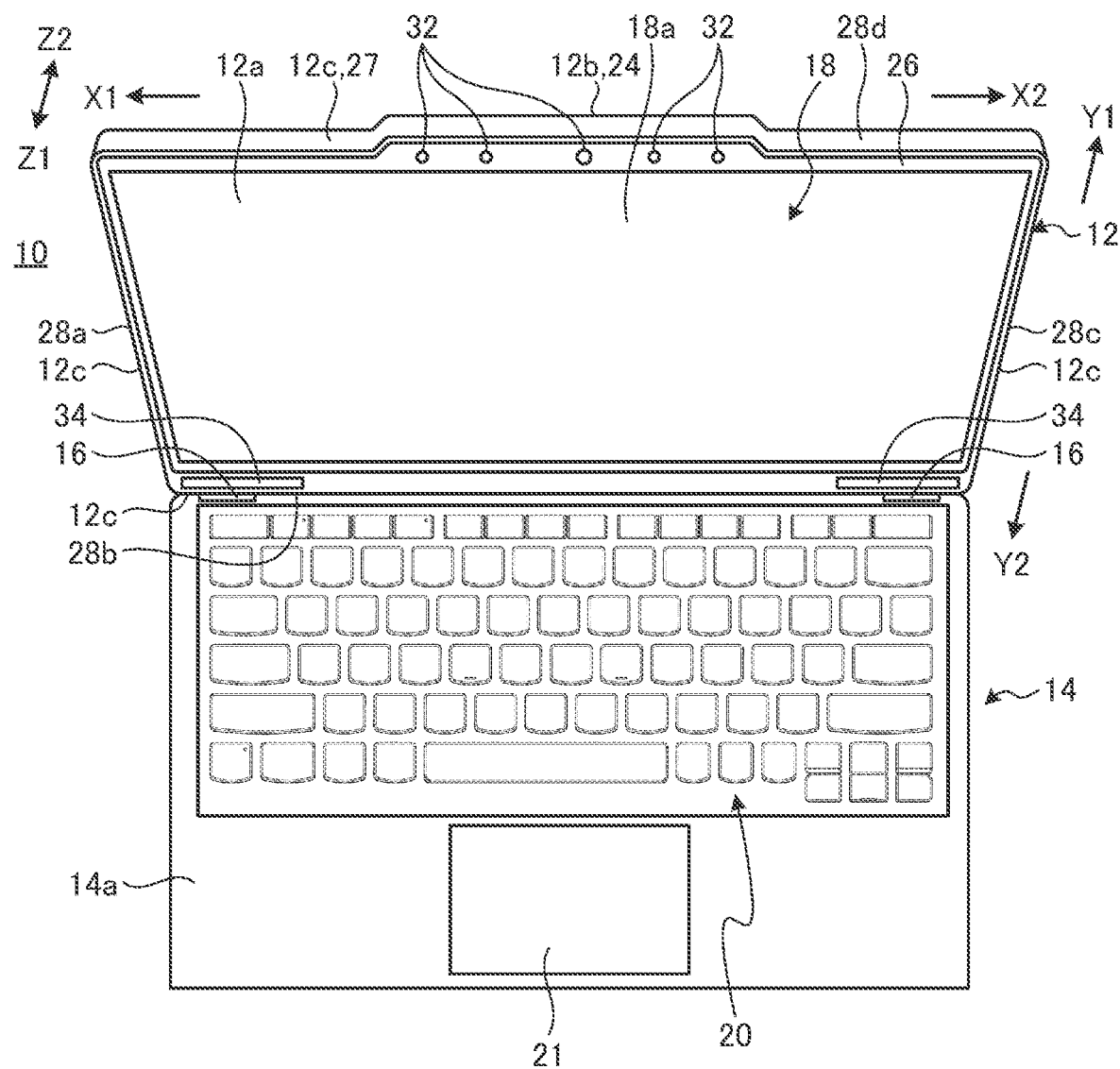
FIG. 1 is a schematic plan view of an electronic apparatus according to an embodiment as seen from above.

FIG. 1 is a schematic plan view of an electronic apparatus 10 according to an embodiment as seen from above. As illustrated in FIG. 1, the electronic apparatus 10 according to this embodiment is a clamshell-type laptop PC, and has a structure in which a first chassis 12 and a second chassis 14 are relatively rotatably connected by a hinge 16. The first chassis 12 carries a display panel 18. The second chassis 14 carries a keyboard 20 and the like so as to be exposed on a top surface 14a, and contains a motherboard and the like inside. The electronic apparatus according to the present invention is not limited to a laptop PC, and may be, for example, a single display apparatus, a tablet PC, a mobile phone, a smartphone, a portable game machine, or the like.

In the following description of the electronic apparatus 10, with respect to a state in which the first chassis 12 is open from the second chassis 14 and their surface normal directions are orthogonal to each other (i.e. a state in which the angle between the chassis 12 and 14 is) 90°, the left and right directions are respectively denoted as X1 and X2 directions, the up and down directions are respectively denoted as Y1 and Y2 directions, and the depth directions are denoted as Z1 and Z2 directions, as seen from a user viewing the display panel 18. The X1 and X2 directions may be collectively referred to as "X direction". The same applies to the Y1 and Y2 directions and the Z1 and Z2 directions.

The second chassis 14 is a flat box body, and is adjacent to the first chassis 12. The second chassis 14 internally contains various electronic components such as a motherboard including a CPU and the like, a battery device, a memory, and an antenna device. The keyboard 20 and a touchpad 21 are exposed on the top surface 14a of the second chassis 14.

The first chassis 12 is a flat box body thinner than the second chassis 14. The display panel 18 has a display surface 18a exposed on the Z1-side surface (front surface 12a) of the first chassis 12. The first chassis 12 includes a chassis member 24 that forms the Z2-side surface (rear surface 12b) and a bezel member 26 that forms the peripheral edges of the front surface 12a. The top, bottom, left, and right side surfaces 12c of the first chassis 12 are formed by a standing wall 27 standing from the four peripheral edges of the chassis member 24. The hinge 16 connects the Y2-side edge of the first chassis 12 and the 22-side edge of the second chassis 14.

The display panel 18 is, for example, composed of a liquid crystal display or an organic EL display. For example, the display panel 18 has a structure in which glass, a liquid crystal layer, a light guide plate, and the like are laminated and the outer peripheral edges of the respective layers are fixed to each other by a double-sided tape, an adhesive, or the like. The display panel 18 may be of touch-panel type.

The chassis member 24 is a rectangle whose Y-direction dimension is smaller than the X-direction dimension when seen from the front, and the display panel 18 is a rectangle slightly smaller than the chassis member 24. Herein, regarding the first chassis 12 and the chassis member 24, the left edge is a first edge 28a, the edge on the side where the hinge 16 is located is a second edge 28b, the right edge is a third edge 28c, and the edge on the side where the below-described electrical devices 32 are located is a fourth edge 28d. That is, the first edge 28a and the third edge 28c in the vertical direction (Y direction) are orthogonal to the second edge 28b and the fourth edge 28d in the horizontal direction (X direction). The first edge 28a and the third edge 28c are opposite to each other, and the second edge 28b and the fourth edge 28d are opposite to each other.

A plurality of electrical devices 32 are provided in the center part of the bezel member 26 along the fourth edge 28d so as to face the front. Examples of the electrical devices 32 include a camera, a microphone, and an infrared port. Other electrical devices such as an antenna may be provided in the first chassis 12. The part of the bezel member 26 where the electrical devices 32 are located is slightly thicker in the Y direction, but the other parts are considerably thin, which is desirable in terms of design. A cover 34 covers the left and right end parts of the bezel member 26 along the second edge 28b.

Figure 2:
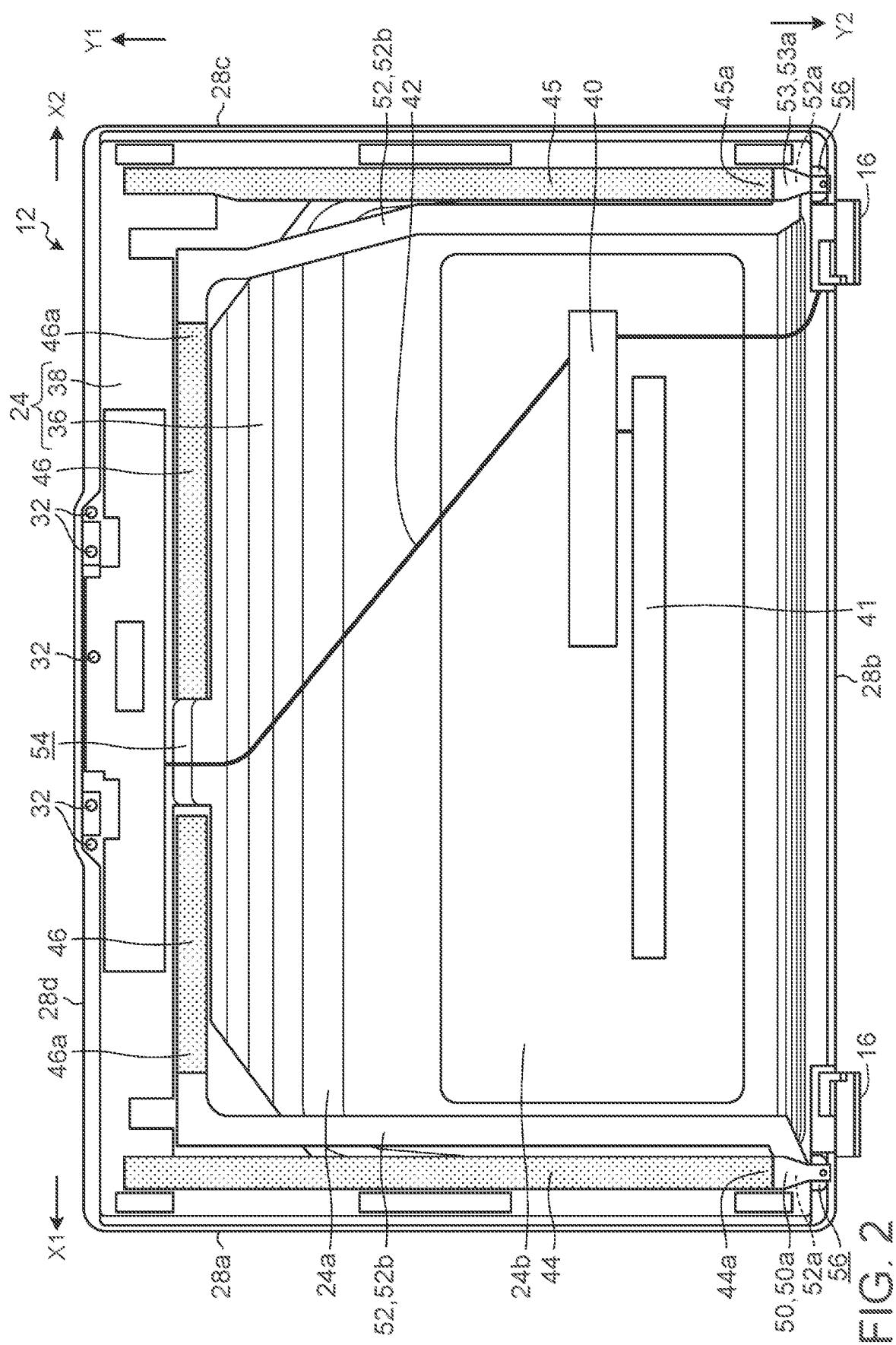
FIG. 2 is a schematic front view of a first chassis in a state in which a bezel member and a display panel are removed.
Figure 3:
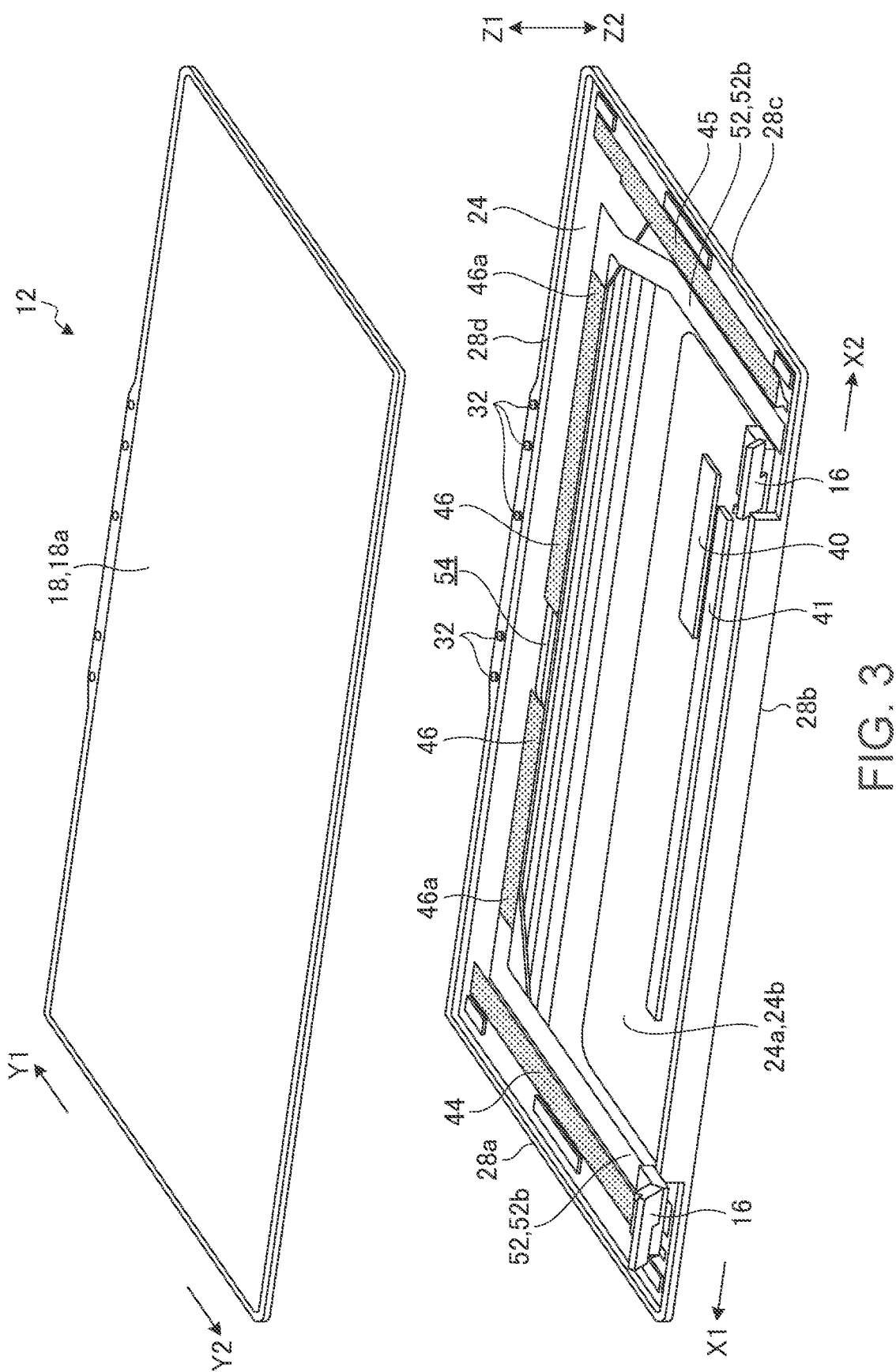
FIG. 3 is an exploded perspective view of the display panel and a chassis member.

FIG. 2 is a schematic front view of the first chassis 12 in a state in which the bezel member 26 and the display panel 18 are removed. FIG. 3 is an exploded perspective view of the display panel 18 and the chassis member 24. The bezel member 26 and wiring 42 are omitted in FIG. 3.

As illustrated in FIG. 2, the chassis member 24 in this embodiment includes a rectangular plate portion 36 forming a major part including a center part, and a frame portion 38 joined to the outer peripheral edges of the plate portion 36.

The plate portion 36 is composed of, for example, a prepreg laminate, a resin plate, or a metal plate of aluminum, titanium, or the like. For example, the prepreg laminate has a structure in which a plurality of layers of a prepreg obtained by impregnating reinforced fibers of a carbon resin or the like with a matrix resin (for example, a thermosetting resin or a thermoplastic resin such as an epoxy resin) are laminated and, depending on the specifications, an intermediate material such as a foam is interposed between the prepreg layers. In this embodiment, the plate portion 36 is a carbon fiber reinforced resin plate (CFRP plate) using carbon fibers as reinforced fibers.

The frame portion 38 is formed by injection molding a resin material at the outer peripheral edges of the plate portion 36 and joining the resin material to the outer peripheral edges. Examples of the resin material forming the frame portion 38 include a polyethylene resin and a polypropylene resin. A fiber reinforced resin (for example, GFRP) obtained by containing reinforced fibers such as glass fibers in such a resin may also be used. The plate portion 36 formed by a carbon fiber reinforced resin plate is lightweight and has high strength, but has a problem of workability in machining or shaping. Accordingly, in the chassis member 24, the frame portion 38 made of a resin material is located around the plate portion 36.

The chassis member 24 has a concave curved surface portion 24b as a result of the inner surface 24a being recessed smoothly, as designated by a contour-like oval pattern in FIGS. 2 and 3. The curved surface portion 24b is formed by bulging part or whole of the region of the plate portion 36 to the rear surface 12b side to recess the inner surface 24a like a dish. Thus, the chassis member 24 has a dome shape as part or whole of the chassis member 24 on the rear surface 12b side slightly bulges rearward. The curved surface portion 24b has a biased concave shape that is deeper on the hinge 16 side (Y2 side) than on the Y1 side, contributing to well-balanced design. The chassis member 24 may be planar.

The chassis member 24 is provided with a display controller 40 and a connection portion 41 that connects the display controller 40 and the display panel 18. The display controller 40 is a component that controls at least part of the display panel 18. The display controller 40 and the connection portion 41 are components that are elongate in the X direction, and are adjacent to each other in the deepest part of the curved surface portion 24b. The display controller 40 and the connection portion 41 are thin, and therefore can be placed in the curved surface portion 24b. The display controller 40 and the connection portion 41 can shorten the distance of electrical connection with the second chassis 14.

The electrical devices 32 are provided in the part of the chassis member 24 along the fourth edge 28c, as mentioned above. The display controller 40 and the electrical devices 32 are electrically connected to the second chassis 14 by wiring 42. The wiring 42 is routed between the second chassis 14 and the electrical devices 32, and is connected to the display controller 40 along the way.

The display panel 18 and the chassis member 24 are fixed to each other by a vertical first adhesive tape 44 and third adhesive tape 45 and a pair of horizontal second adhesive tapes 46. Each of the adhesive tapes 44, 45, and 46 is a double-sided tape and has tensile peeling capability, and is a component called a stretch release tape, a stretch double-sided tape, or a stretchable tape. Such a component has high adhesive strength when not stretched but decreases in adhesive strength when stretched. In FIGS. 2 and 3, the adhesive tapes 44, 45, and 46 are designated by dots so as to be identifiable.

The first adhesive tape 44 is located along the first edge 28a of the chassis member 24 (i.e. in the Y direction), and the third adhesive tape 45 is located along the third edge 28c of the chassis member 24. The second adhesive tapes 46 are located between the first adhesive tape 44 and the third adhesive tape 45 in a direction orthogonal to the first adhesive tape 44 and the third adhesive tape 45 (i.e., in the X direction). The pair of second adhesive tapes 46 are arranged side by side in the X direction along the fourth edge 28d so as to form a gap 54 therebetween. The wiring 42 is passed through the gap 54. The adhesive tapes 44, 45, and 46 are arranged substantially in a U-shape so as to surround the curved surface portion 24b. Basically, substantially all of the adhesive tapes 44, 45, and 46 are located in the planar parts of the frame portion 38, avoiding the curved surface portion 24b.

To stably fix the display panel 18 to the chassis member 24, it is desirable to provide double-sided adhesive tape vertically and horizontally, as mentioned above. Hence, in the electronic apparatus 10 according to this embodiment, the first adhesive tape 44 and the third adhesive tape 45 fix the left and right edges of the display panel 18 in the vertical direction in FIG. 2, and the pair of second adhesive tapes 46 arranged substantially transversely in the horizontal direction fix the part of the display panel 18 on the Y1 side (i.e., the part along the fourth edge 28d). Thus, the display panel 18 is kept from peeling off from the chassis member 24 even in the case where, for example, a twisting external force is applied to the first chassis 12. For fixation in the vertical direction, using only one of the first adhesive tape 44 and the third adhesive tape 45 still has a reasonable effect. By using both the first adhesive tape 44 and the third adhesive tape 45, however, the display panel 18 can be fixed more stably.

For fixation in the horizontal direction, the second adhesive tapes 46 may fix the part of the display panel 18 on the Y2 side, i.e., the part along the second edge 28b. It is, however, preferable to provide the second adhesive tapes 46 in the Y1-side part along the fourth edge 28d, for the following reasons: The curved surface portion 24b is located in the Y2-side part, and the display controller 40 and the connection portion 41 are arranged in the curved surface portion 24b. In addition, part of the display panel 18 has a folding structure. It is therefore difficult to provide the second adhesive tapes 46 in the Y2-side part. Moreover, the display panel 18 is provided with an additional fixing means for the chassis member 24 in the Y2-side part in some cases. In such cases, the Y2-side part is stably fixed without the second adhesive tapes 46.

The first adhesive tape 44 has a first tab 50 for tensile peeling operation extending from the Y2-side end 44a to the second edge 28b. The third adhesive tape 45 has a third tab 53 for tensile peeling operation extending from the Y2-side end 45a to the second edge 28b. The first adhesive tape 44 extends along the first edge 28a substantially throughout its length, and the third adhesive tape 45 extends along the third edge 28c substantially throughout its length. The first tab 50 and the third tab 53 are short.

The pair of second adhesive tapes 46 each have a second tab 52 for tensile peeling operation extending from the end 46a closer to the corresponding one of the first edge 28a and the third edge 28c to the second edge 28b. Since each second adhesive tape 46 is located closer to the Y1 side, the second tab 52 is long. The second tab 52 extends in parallel with the adjacent one of the first adhesive tape 44 and the third adhesive tape 45 on the inner side of the adhesive tape with a narrow gap therebetween. Part or substantially whole of the second tab 52 is within the curved surface portion 24b. The second tab 52 is basically linear, but may be slightly curved due to layout constraints and the like. In this embodiment, the left second tab 52 is linear, and the right second tab 52 is gently bent near the Y1 side.

It is structurally possible to extend the tabs 50, 52, and 53 not to the second edge 28b but to the fourth edge 28d. In such a case, however, the pull-out portion of each of the tabs 50, 52, and 53 is located near the fourth edge 28d. This makes it difficult to make the bezel member 26 thin in that part, which is undesirable in terms of design. Hence, the tabs 50, 52, and 53 extend to the second edge 28b in the electronic apparatus 10.

Figure 4:
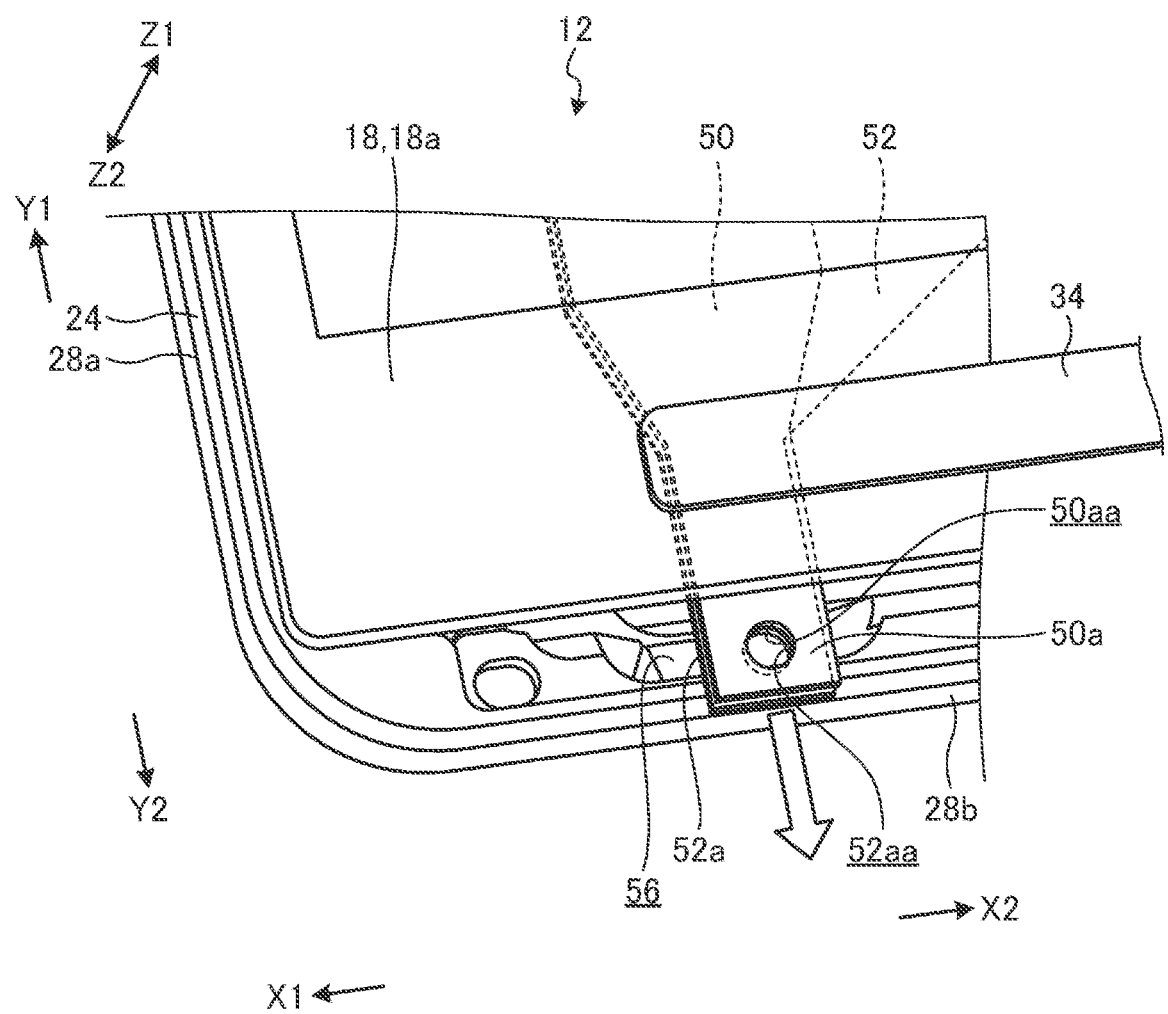
FIG. 4 is a perspective view of a state in which a cover at an end of the first chassis is removed.
Figure 5:
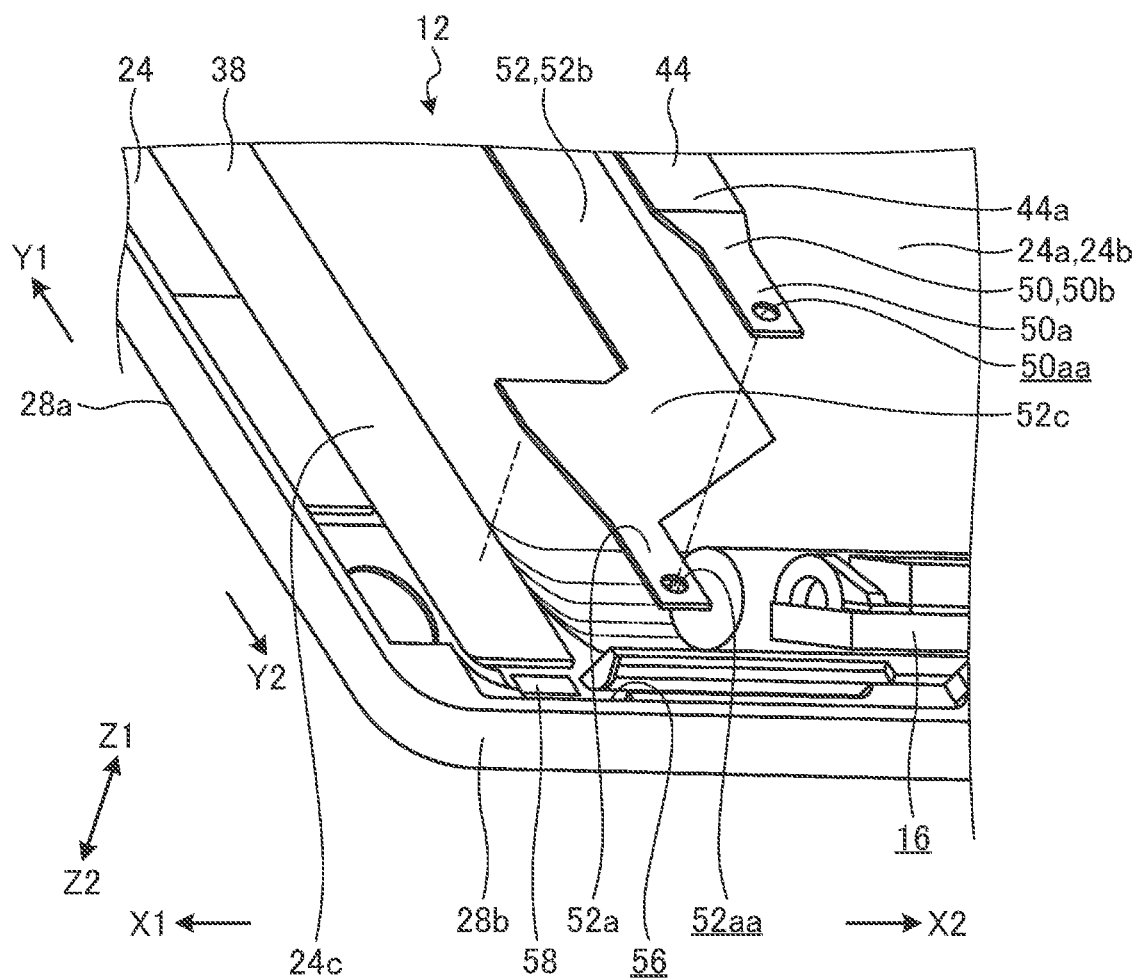
FIG. 5 is an exploded perspective view of the chassis member, a first tab, and a second tab.

FIG. 4 is a perspective view of a state in which the cover 34 at the end of the first chassis 12 is removed. FIG. 5 is an exploded perspective view of the chassis member 24, the first tab 50, and the second tab 52. The first tab 50 and the second tab 52 in the left end part of the first chassis 12 are illustrated in FIGS. 4 and 5. The third tab 53 and the second tab 52 in the right end part are symmetrical to the first tab 50 and the second tab 52 in the left end part, and accordingly their illustration and description are omitted.

The first tab 50 includes a rectangular tip portion 50a slightly thinner than the first adhesive tape 44, and a tapered portion 50b connecting the tip portion 50a and the first adhesive tape 44. The tip portion 50a has a hole 50aa. The third tab 53 has the same shape as the first tab 50. The second tab 52 includes a tip portion 52a having the same shape as the tip portion 50a, an extension portion 52b in parallel with the first adhesive tape 44, and a bent portion 52c connecting the tip portion 52a and the extension portion 52b. The tip portion 52a has a hole 52aa. The bent portion 52c has a shape bent like a crank.

The second tab 52 of one of the two second adhesive tapes 52 located closer to the first edge 28a overlaps the first tab 50 in the vicinity of the second edge 28b. In detail, the second tab 52 is adjacent to the first adhesive tape 44 at the extension portion 52b but is slightly shifted leftward at the bent portion 52c, so that the tip portion 50a and the tip portion 52a are at the same position in the X direction. The tip portion 52a is located closer to the Z2 side than the tip portion 50a, and overlaps the tip portion 50a. Likewise, the second tab 52 of the other one of the two second adhesive tapes 52 located closer to the third edge 28c overlaps the third tab 53 in the vicinity of the second edge 28b (see FIG. 2). That is, the chassis member 24, the second tab 52, the first tab 50 (or the third tab 53), and the display panel 18 overlap in this order.

The tip portion 50a and the tip portion 52a overlap in the vicinity of the second edge 28b, specifically, inside a recessed pocket (recessed portion) 56 formed in the chassis member 24. Although the tip portion 50a and the tip portion 52a protrude from the pocket 56 in FIG. 4, each of the tip portion 50a and the tip portion 52a can be rolled up and stored inside the pocket 56. The pocket 56 is open on the Z1 side and the Y1 side, and is closed by the chassis member 24 on the other sides. The pocket 56 is covered with the cover 34 on the Z1 side, and is not visible to the user during normal use.

As a result of the tip portion 50a and the tip portion 52a overlapping in this way, the width occupied by the tip portions in the X direction shortens, so that the layout of the hinge 16 and the like is less affected. Moreover, by providing the pocket 56 in the chassis member 24, the first tab 50 and the second tab 52 can be stored in the pocket 56 during normal use by the user, and protruded by an appropriate extent during tensile peeling operation by the operator. This contributes to easier work.

The bent portion 52c of the second tab 52 is peelably fixed to the bottom surface of the pocket 56 by an adhesive 58. The adhesive 58 has a small area and has relatively weak adhesive strength, allowing peeling by pulling the tip portion 52a. Thus, the second tab 52 is fixed to the chassis member 24 in the vicinity of the second edge 28b and also is fixed by the second adhesive tape 46 in the vicinity of the fourth edge 28d on the opposite side, so that displacement of the extension portion 52b therebetween can be prevented. Even in the case where the electronic apparatus 10 is subjected to impact during assembly or normal use or when being carried, the extension portion 52b is maintained in position and is kept from coming into contact with and adhering to the adjacent first adhesive tape 44.

Figure 6:
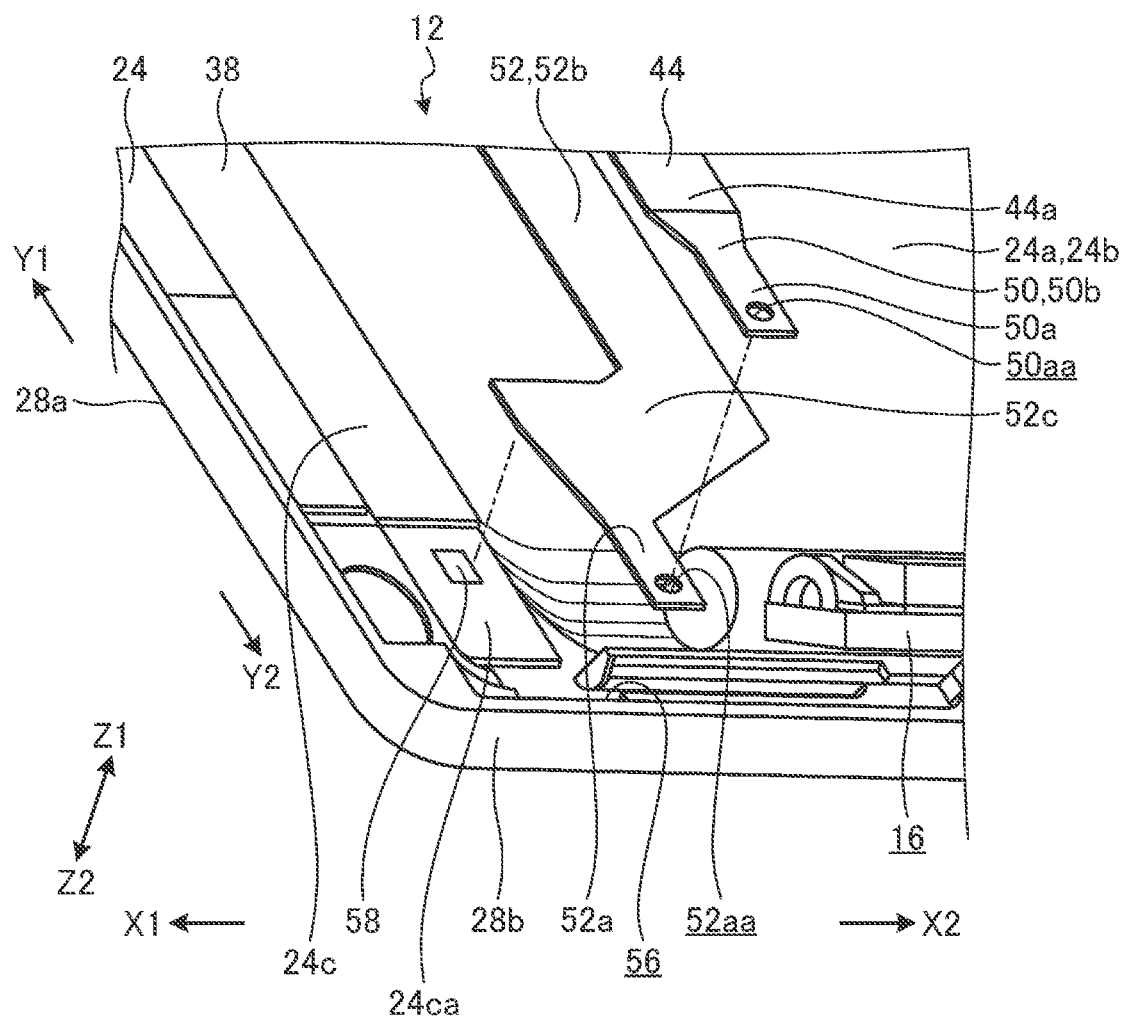
FIG. 6 is an exploded perspective view of a chassis member, a first tab, and a second tab according to a modification.

FIG. 6 is an exploded perspective view of the chassis member 24, the first tab 50, and the second tab 52 according to a modification. In this modification, the frame portion 38 has an abutting surface 24c to which the first adhesive tape 44 is attached, and the abutting surface 24c is provided with a step surface 24ca near the second edge 28b. The step surface 24ca is slightly lower than the abutting surface 24c, and the adhesive 58 is provided on the step surface 24ca. In this modification, the bent portion 52c fits on the step surface 24ca and is fixed by the adhesive 58. This further widens the attachment area of the first adhesive tape 44.

In the electronic apparatus 10 having the above-described structure, when removing the display panel 18, the cover 34 is removed to expose the pocket 56, and then the tip portion 50a of the first tab 50 and the tip portion 52a of the second tab 52 rolled up and stored in the pocket 56 are taken out as illustrated in FIG. 4.

After this, first the tip portion 50a on the top side (Z1 side) as seen from the operator is pulled out to the front (i.e. in the arrow direction in FIG. 4) with a tool or by hand. As a result, the first adhesive tape 44 is pulled out together with the first tab 50. Here, since the extension portion 52b of the adjacent second tab 52 is maintained at a position with a gap from the first adhesive tape 44, only the first adhesive tape 44 can be pulled out stably without pulling out the second tab 52 together with the first adhesive tape 44.

Next, the remaining tip portion 52a is pulled out to the front with a tool or by hand. The adhesive 58 does not interfere with pulling out the tip portion 52a, as mentioned above. Since the second adhesive tape 46 is connected to the tip portion 52a via the extension portion 52b, the second adhesive tape 46 is pulled out together with the tip portion 52a. The holes 50aa and 52aa are preferably used for pulling out the tip portions 50a and 52a. The third adhesive tape 45 and the second adhesive tape 46 on the right are pulled out by the same procedure.

After the first adhesive tape 44, the third adhesive tape 45, and the pair of second adhesive tapes 46 are pulled out, the display panel 18 can be removed from the chassis member 24. Thus, in the electronic apparatus 10, the display panel 18 can be easily removed basically by a simple operation of pulling out the tip portions 50a, 52a, and 53a.

Moreover, in the electronic apparatus 10, the display panel 18 can be stably fixed because the first adhesive tape 44 and the third adhesive tape 45 are orthogonal to the second adhesive tapes 46. Since the first adhesive tape 44 and the second adhesive tape 46 are separate and each have a thin tape shape, cutting these tapes out of the material sheet is not wasteful and the costs are low.

As mentioned above, the tip portion 50a and the tip portion 52a are to be pulled out basically in this order in which they are seen from the operator, and the order is unlikely to be mistaken. The mistake can be further prevented if the tip portion 50a and the tip portion 52a are varied in color, shape, pattern, mark, or the like so as to be identifiable. The tip portion 50a and the tip portion 52a may be provided with notes such as "Pull first" and "Pull next" or numbers indicating the order.

In the foregoing example, the two second adhesive tapes 46 are arranged side by side in the longitudinal direction (i.e., the X direction) with the gap 54 therebetween. In the case where the wiring 42 and the gap 54 are not required depending on the design conditions, however, the number of second adhesive tapes 46 may be one, and the second tab 52 may be provided at one end of the second adhesive tape 46.

The present invention is not limited to the foregoing embodiments, and changes can be freely made without departing from the scope of the present invention.

The invention claimed is:

1. An electronic apparatus comprising:
a display panel;
a rectangular chassis member having a first edge, a second edge orthogonal to the first edge, a third edge orthogonal to the second edge and opposite to the first edge, and a fourth edge orthogonal to the third edge and opposite to the second edge, all on a rear surface side of the display panel;
a tensile-peelable first adhesive tape that fixes the display panel and the chassis member to each other; and
a tensile-peelable second adhesive tape that is separate from the first adhesive tape,
wherein the first adhesive tape is along the first edge, and has a first tab with a first hole at an end thereof for tensile peeling operation extending to the second edge, and
wherein the second adhesive tape is orthogonal to the first adhesive tape, and has a second tab with a second hole at an end thereof for tensile peeling operation extending from one end thereof to the second edge,
wherein the first tab and the second tab extend over a raised portion of one of the first edge, the second edge, the third edge, and the fourth edge of the chassis member, in a plane view of a top side of the chassis member;
wherein the first hole is colinearly aligned with the second hole.

2. The electronic apparatus according to claim 1, wherein the first tab and the second tab overlap near the second edge.

3. The electronic apparatus according to claim 1, wherein a recessed portion configured to store the first tab and the second tab is in the second edge of the chassis member.

4. The electronic apparatus according to claim 1, wherein part of the second tab is peelably fixed to the chassis member.

5. The electronic apparatus according to claim 1, further comprising
a tensile-peelable third adhesive tape that fixes the display panel and the chassis member to each other,
wherein the third adhesive tape is along the third edge, and
wherein the third adhesive tape has a third tab for tensile peeling operation extending to the second edge.

6. The electronic apparatus according to claim 5, wherein the second adhesive tape comprises two second adhesive tape portions arranged side by side in a longitudinal direction with a gap therebetween, wherein the second tab of one of the two second adhesive tape portions that is closer to the first edge overlaps the first tab near the second edge, and wherein the second tab of the other one of the two second adhesive tape portions that is closer to the third edge overlaps the third tab near the second edge.

\* \* \* \* \*